(12) United States Patent
Arghavani

(10) Patent No.: US 7,323,391 B2
(45) Date of Patent: Jan. 29, 2008

(54) SUBSTRATE HAVING SILICON GERMANIUM MATERIAL AND STRESSED SILICON NITRIDE LAYER

(75) Inventor: Reza Arghavani, Scotts Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 143 days.

(21) Appl. No.: 11/037,684

(22) Filed: Jan. 15, 2005

(65) Prior Publication Data

US 2006/0160314 A1 Jul. 20, 2006

(51) Int. Cl.
*H01L 21/336* (2006.01)

(52) U.S. Cl. .............................. 438/285; 257/E29.105; 257/E29.107; 257/E29.104

(58) Field of Classification Search ................ 438/199, 438/275, 285; 257/E29.105, E29.107, E29.108, 257/E29.104
See application file for complete search history.

(56) References Cited

U.S. PATENT DOCUMENTS

| | | | |
|---|---|---|---|
| 4,089,992 A | 5/1978 | Doo et al. | |
| 4,118,539 A | 10/1978 | Hirai et al. | |
| 4,279,947 A | 7/1981 | Goldman et al. | |
| 4,395,438 A | 7/1983 | Chiang | |
| 4,435,898 A | 3/1984 | Gaur et al. | |
| 4,717,602 A | 1/1988 | Yamazaki | |
| 4,877,651 A | 10/1989 | Dory | |
| 4,894,352 A | 1/1990 | Lane et al. | |
| 6,342,456 B1 | 1/2002 | Jenkins et al. | |
| 2004/0009680 A1 | 1/2004 | Luo et al. | |
| 2005/0242376 A1* | 11/2005 | Chen et al. | 257/214 |
| 2005/0247986 A1* | 11/2005 | Ko et al. | 257/411 |
| 2005/0255667 A1 | 11/2005 | Arghavani et al. | |
| 2005/0266632 A1* | 12/2005 | Chen et al. | 438/233 |
| 2005/0285187 A1* | 12/2005 | Bryant et al. | 257/335 |
| 2006/0105106 A1 | 5/2006 | Balseanu et al. | |
| 2006/0145264 A1* | 7/2006 | Chidambarrao et al. | 257/369 |
| 2006/0151832 A1* | 7/2006 | Murthy et al. | 257/344 |

OTHER PUBLICATIONS

Johnson et al, Characterization of LPCVD of Silicon Nitride in a Rapid Thermal Processor, Mat. Res. Soc. Syp. Proc. 146:345-350 (1989), Raleigh, NC.

Arghavani, R., et al., "A Reliable and Manufacturable Method to Break the PMOS 1mA/µml$_{DSAT}$ Barrier in High Volume Manufacturing", White Paper, undated, pp. 1-7.

(Continued)

*Primary Examiner*—Trung Dang
(74) *Attorney, Agent, or Firm*—Pillsbury Winthrop Shaw Pittman

(57) ABSTRACT

A method of fabricating a semiconductor device includes providing a region having doped silicon region on a substrate, and forming a silicon germanium material adjacent to the region on the substrate. A stressed silicon nitride layer is formed over at least a portion of the doped silicon region on the substrate. The silicon germanium layer and stressed silicon nitride layer induce a stress in the doped silicon region of the substrate. In one version, the semiconductor device has a transistor with source and drain regions having the silicon germanium material, and the doped silicon region forms a channel that is configured to conduct charge between the source and drain regions. The stressed silicon nitride layer is formed over at least a portion of the channel, and can be a tensile or compressively stressed layer according the desired device characteristics.

29 Claims, 4 Drawing Sheets

OTHER PUBLICATIONS

Chidambaram, P.R., et al., "35% Drive Current Improvement from Recessed-SiGe Drain Extensions on 37 nm Gate Length PMOS", *2004 Symp. On VLSI Tech. Digest of Tech. Papers*, pp. 48-49.

Ge, C.H., et al., "Process-Strained Si (PSS) CMOS Technology Featuring 3D Strain Engineering", *IEDM - IEEE*, 2003, pp. 3.7.1 - 3.7.4.

Rim, K., et al., "Fabrication and Analysis of Deep Submicron Strained-Si N-MOSFET's", *IEEE Trans. On Electron Devices*, 47:7, Jul. 2000, pp. 1406 - 1415.

Thompson, S.E., et al., "A Logic Nanotechnology Featuring Strained-Silicon", *IEEE Electron Device Letters*, 25:4, Apr. 2004, pp. 191-193.

* cited by examiner

SUBSTRATE HAVING SILICON GERMANIUM MATERIAL AND STRESSED SILICON NITRIDE LAYER

BACKGROUND

In the processing of a substrate in a chamber to fabricate circuits and displays, the substrate is typically exposed to energized gases that are capable of, for example, depositing or etching material on the substrate. For example, in a chemical vapor deposition (CVD) process, process gases are energized by for example, microwave or RF energy, to deposit a film on the substrate. The deposited films are further processed to create devices on the substrate such as, for example, metal-oxide-semiconductor field effect transistors (MOSFETs), which typically have a source region, a drain region, and a channel region there between. A gate electrode, above and separated from the channel by a gate dielectric, controls conduction between the source and drain. The performance of such MOSFETs can be improved, by for example, reducing supply voltage, gate dielectric thickness or channel length. However, these methods have diminishing returns as transistors shrink in size. For example, the advantages of reducing channel length, such as increasing the number of transistors per unit area and increasing the transistor saturation current, begin at very small channel lengths to be offset by carrier velocity saturation effects. Benefits from gate dielectric thickness reduction, such as decreased gate delay, are offset by increased gate leakage current and charge tunneling through the dielectric which may damage the transistor over time. Reducing the supply voltage allows for lower operating power, but reductions in the supply voltage are limited by the transistor threshold voltage.

Strain engineering, in which the atomic lattice of a deposited material is strained to affect the properties of the material, is used to further enhance transistor performance. Lattice strain can increase the carrier mobility of semiconductors, such as for example silicon, which increases the saturation current of transistors, thus increasing their performance. Strain can be introduced into materials formed on substrates in a number of ways. For example, localized strain and stress can be induced in the channel region of the transistor by the deposition of component layers of the transistor which have internal compressive or tensile stress. In one version, silicon nitride layers are used as etch stop layers and as spacers during the formation of silicide layers on the gate electrode, and can be deposited to have a tensile stress which can induce a stress in the channel region. Examples of embodiments of layered structures capable of inducing strain in the channel region are described, for example, in "Process-Strained SI (PSS) CMOS Technology Featuring 3D Strain Engineering," Ge et al, *IEEE* 0-7803-7873-3/2003, which is herein incorporated by reference in its entirety. However, such stressed layers may still fail to provide sufficient carrier mobility improvement to meet the rapidly advancing transistor performance requirements.

In yet another method, the lattice structure of the channel region can be strained by forming structures comprising silicon germanium on the substrate. Strain engineering with these materials centers on the nearly 4.2% lattice mismatch between single crystal Ge and Si lattice structures. The electronic conduction and valence band structure of SiGe was well established following the early preparation of homogeneous SiGe alloys nearly four decease ago. The advent of pseudomorphic deposition of Si on $Ge_xSi_{1-x}$. extended this understanding to strained lattice structures and enabled examination of electrical characteristics of Si. The strained silicon typically has higher carrier mobility compared to the relaxed Si lattice structure, which is at least partly due to reduced inter-valley phonon scattering and lower effective mass. An example of strained Si formed over silicon germanium is described, for example in "Fabrication and Analysis of Deep Submicron Strained-Si N-MOSFET'S", Rim et al, *IEEE Transactions on Electron Devices*, Vol. 47, No. 7, July 2000, which is herein incorporated by reference in its entirety.

The use of silicon germanium as a source and drain material to induce strain in a neighboring channel region has also been explored, for example in "A Logic Nanotechnology Featuring Strained-Silicon," Thompson et al, *IEEE Electron Device Letters*, Vol. 25, No. 4, April 2004, and "35% Drive Current Improvement from Recessed-SiGe Drain Extensions on 37 nm Gate Length PMOS," Chidambaram et al, *IEEE* 2004 *Symposium on VLSI Technology, Digest of Technical Papers,* both of which are herein incorporated by reference in their entireties. However, the silicon germanium material has not provided sufficient carrier mobility improvement to allow for the development of next generation devices with the desired performance.

Thus; there is a need for semiconductor devices having transistors with improved carrier mobility that provide enhanced device performance, and methods of fabricating such transistors. There is a further need for materials capable of inducing strain in channel regions of transistors to provide a desired level of carrier mobility and change conductance in the channel.

SUMMARY

In one version, a method of fabricating a semiconductor device involves providing a doped silicon region a substrate. A silicon germanium material is formed adjacent the doped silicon region on the substrate, and a stressed silicon nitride layer is formed over at least a portion of the doped silicon region. The silicon germanium layer and stressed silicon nitride layer induce a strain in the doped silicon region son the substrate. In one embodiment, a transistor is formed on the substrate, the transistor including a source region and a drain region having the silicon germanium material. A channel region configured to conduct charge between the source region and drain region is also formed, the channel region having doped silicon, whereby strain is induced in the channel region by the silicon germanium material. Alternatively, the channel region may comprise germanium. A stressed silicon nitride layer is formed over at least a portion of the transistor, the stressed silicon nitride layer being capable of inducing strain in the channel region. The silicon germanium material and the overlying stressed silicon nitride layer induce strain in the channel region that increase the carrier mobility of channel region.

In one version, a semiconductor device has a transistor having source and drain regions with silicon germanium material. The transistor has a channel region configured to conduct charge between the source and drain regions, the channel region having doped silicon, whereby a strain is induced in the channel region by the silicon germanium material. Alternatively, the channel region may comprise germanium. A stressed silicon nitride layer is formed over at least a portion of the transistor, the stressed silicon nitride layer being capable of inducing strain in the channel region. The silicon germanium material and the overlying stressed silicon nitride layer induce strain in the channel region that increase the carrier mobility of channel region.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
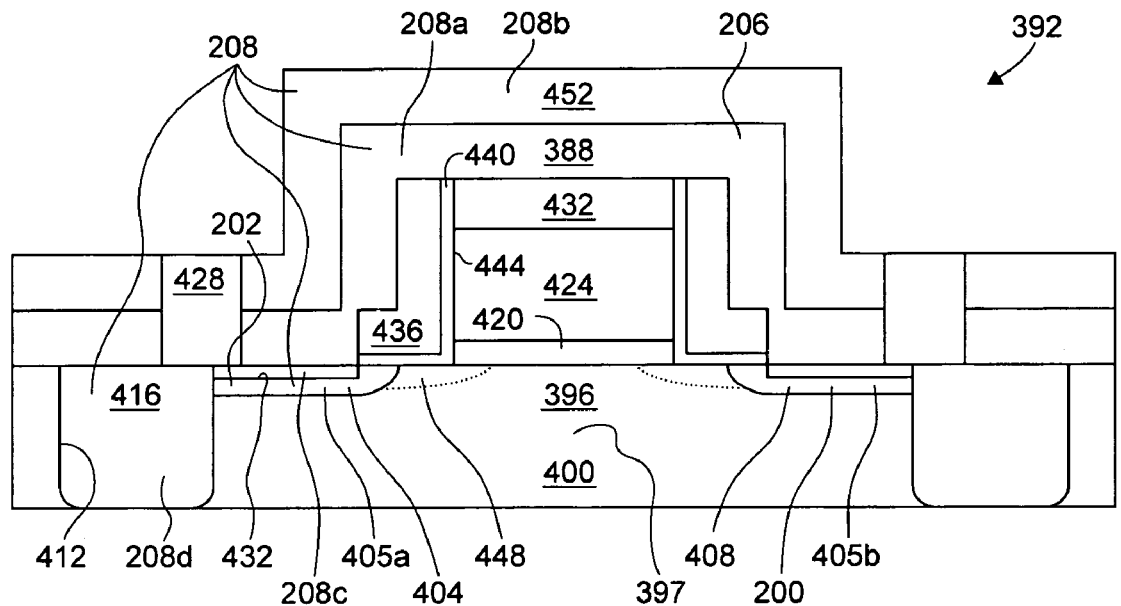
FIG. 1 is a cross-sectional side view of an embodiment of a transistor having a stress-inducing material.

The present invention relates to the formation of strain-inducing materials on a substrate 400 to improve the performance of transistors 392 on a semiconductor device. An example of a transistor 392 on a substrate 400 is illustrated in FIG. 1, which shows a general embodiment of a MOSFET transistor 392. The transistor 392 comprises a source region 404 and a drain region 408, and a channel region 396 configured to conduct charge between the source and drain regions 404,408. The channel region 396 typically comprises doped silicon, such as for example silicon comprising n or p-type dopants. Alternatively the channel region 396 may comprise a material other than doped silicon, such as for example germanium. A gate oxide layer 420 and a gate electrode 424 are provided on top of the channel region 396 between the source and drain regions 404, 408.

In one version, stress is induced in the channel region 396 of the transistor 392 to improve the transistor performance. The induced stress increases the carrier mobility in the channel region 396, which is believed to be at least partially due to reduced inter-valley phonon scattering and lower effective mass in the channel region 396. It has been discovered that combining the stress-inducing effects of different materials on a substrate 400 can be used to beneficially tailor and improve the carrier mobility in channel regions 396 of a transistor 392. By selecting different types and compositions of stress-inducing materials, optimum performance can be obtained even for different types of transistors, such as for example, for both N and P-MOS types of transistors 392.

In one version, a first stress-inducing material 200 comprises a silicon germanium material 202 that is capable of inducing stress in the channel region 396. The silicon germanium material 202 is desirably formed in close proximity to the channel region 396 in order to induce the lattice strain effects in the channel material. For example, the silicon germanium material 202 may be separated from the channel region 396 by less than about 50 nanometers, and even less than about 20 nanometers, such as from about 10 to about 20 nanometers, and may even be touching the channel region 396. In the version shown in FIG. 1, the silicon germanium layer 202 is formed in at least one of the source and drain regions 404,408, to exert a stress on the neighboring channel region 396. The stress induced in the channel region 396 by the silicon germanium material 202 may be at least about 1 GPa, such as from about 1 GPa to about 1.3 GPa.

The silicon germanium material 202 may be formed by a suitable method, such as a deposition method. The deposition method desirably forms a silicon germanium material 202 having the general chemical formula $Si_{1-x}Ge_x$, where x is selected to induce the desired stress in the channel region 396, and may be from about 0.15 to about 0.3. In one version, the silicon germanium material 202 is formed by an epitaxial deposition method. An epitaxially deposited silicon germanium material 202 may be capable of creating a uniaxial compressive stress that enhances carrier mobility in the channel region 396, as described for example in "A Logic Nanotechnology Featuring Strained Silicon," to Thompson et al, *IEEE Electron Device Letters,* Vol. 25, No. 4, April 2004, which is herein incorporated by reference in its entirety. In one version, recesses 405a,b can be formed at the source and drain regions 404,408, for example by etching the recesses 405a,b into the substrate 400 in an etching process. An epitaxially grown silicon germanium material 202 can be formed in the recesses 405a,b by exposing the substrate 400 to a silicon-containing gas comprising for example silane, and a germanium-containing gas comprising for example germane. The components of the gas can be energized to form the silicon germanium material 202 on the substrate 400, for example by providing sufficient thermal energy for the reaction to occur, such as by heating the substrate 400 to a sufficiently high temperature. A gas energizer 111 such as a RF or microwave energizer can also or alternatively be provided to energize the deposition gas. A method of epitaxially growing silicon germanium on a substrate is described, for example, in U.S. Pat. No. 6,342,453 to Khandan et al, issued on Jan. 29, 2002 and commonly assigned to Applied Materials, which is herein incorporated by reference in its entirety. Yet another method of depositing a silicon germanium material 202 on a substrate 400 is described for example in U.S. Patent Application Publication No. 2004/0009680 to Luo et al, filed on Jul. 10, 2002 and commonly assigned to Applied Materials, which is also herein incorporated by reference in its entirety. The silicon germanium material 202 in the source and drain regions 404,408 can also be doped, for example with an n or p-type dopant, to provide the desired transistor characteristics. For example, the source and drain regions 404,408 may comprise an n-type dopant for an NMOS transistor 392, and a p-type dopant for a PMOS transistor 392.

Providing a second stress-inducing material 206 on the substrate 400 that enhances the stress-inducing attributes of the first stress-inducing silicon germanium material 202 has been discovered to provide unexpectedly good performance enhancement of the transistor 392. In one version, the second stress-inducing material 206 desirably comprises a stressed layer 208 that exerts a stress on the channel region 396 of the transistor 392. The stressed layer 208 may comprise a tensile stress or a compressive stress, according to the desired transistor type and characteristics. In one version, two or more stressed layers 208a,b,c,d can even be combined on the substrate 400 to provide the desired type and magnitude of stress in the channel region 396. Providing the silicon germanium material 202 in combination with a second stress-inducing material 208 provides improved carrier mobility over transistors 392 with just a single type of stress-inducing material, and also allows for tailoring of the induced stress for different types of transistors 392, such as N and P-type transistors 392.

In one version, the substrate 400 comprises at least one stressed layer 208 comprising a dielectric layer, such as a stressed silicon nitride layer 208a. The stressed silicon nitride layer 208a may be formed by method that provides a layer having either compressive or tensile stress, such as for example a chemical vapor deposition method. The type of stress, namely tensile or compressive, and the stress level of the deposited silicon nitride layer 208a can be set in the deposited layer by controlling a number of different processing parameters or by treating the deposited layer. In one version, the stressed silicon nitride layer 208a has an absolute value of the compressive stress of at least about 2.5 GPa, such as from about 2.5 GPa to about 3.5 GPa. In another version, he stressed silicon nitride layer 208a comprises a tensile stress of at least about 1.5 GPa, such as from about 1.5 GPa to about 2 GPa. In the version shown in FIG. 1, the stressed silicon nitride layer 208b is formed over at least a portion of the channel region 396, and may also be formed over at least a portion of the source and drain regions 404,408.

In one version of a method to deposit the stressed silicon nitride layer, the substrate 400 is exposed to a first gas component that includes a silicon-containing gas, and a second component that includes a nitrogen-containing gas. The first and second components form the reactive components of the process gas. The silicon-containing gas can be, for example, silane, disilane, trimethylsilyl (TMS), tris(dimethylamino)silane (TDMAS), bis(tertiary-butylamino)silane (BTBAS), dichlorosilane (DCS), and combinations thereof. The nitrogen-containing gas can be, for example, ammonia, nitrogen, and combinations thereof. In addition, the process gas may contain a third component that serves as a diluent gas and which is typically a non-reactive gas. The diluent gas can be nitrogen which in this capacity can serve both as a diluent and at least partially as an additional nitrogen-containing gas source; or the diluent gas can be other non-reactive gases such as helium or argon. The gas is energized by a gas energizer 111, such as for example, an RF or microwave energizer, to deposit silicon nitride on the substrate 400. The process parameters, such as the temperature, gas energizer power level, gas flows and flow ratios and pressure, are selected to provide a stressed silicon nitride layer 208a having the desired type and magnitude of stress. The stressed nitride layer 208a may also be treated after deposition to modify the stress in the layer, for example by modifying the amount of hydrogen in the stressed layer through UV or electron beam exposure. Examples of methods for depositing silicon nitride and other layers with desired types and magnitudes of stress are described in Provisional Application No. 60/628,600, filed on Nov. 16, 2004, entitled DECOMPOSITION AND TREATMENT OF TENSILE AND COMPRESSIVE STRESSED LAYERS to Balseanu et al., and U.S. application Ser. No. 11/055,936 filed on Feb. 11, 2005 entitled TENSILE AND COMPRESSIVE STRESSED MATERIALS FOR SEMICONDUCTORS to Balseanu et al., both of which are commonly assigned to Applied Materials, and both of which are herein incorporated by reference in their entirety.

Figure 3:
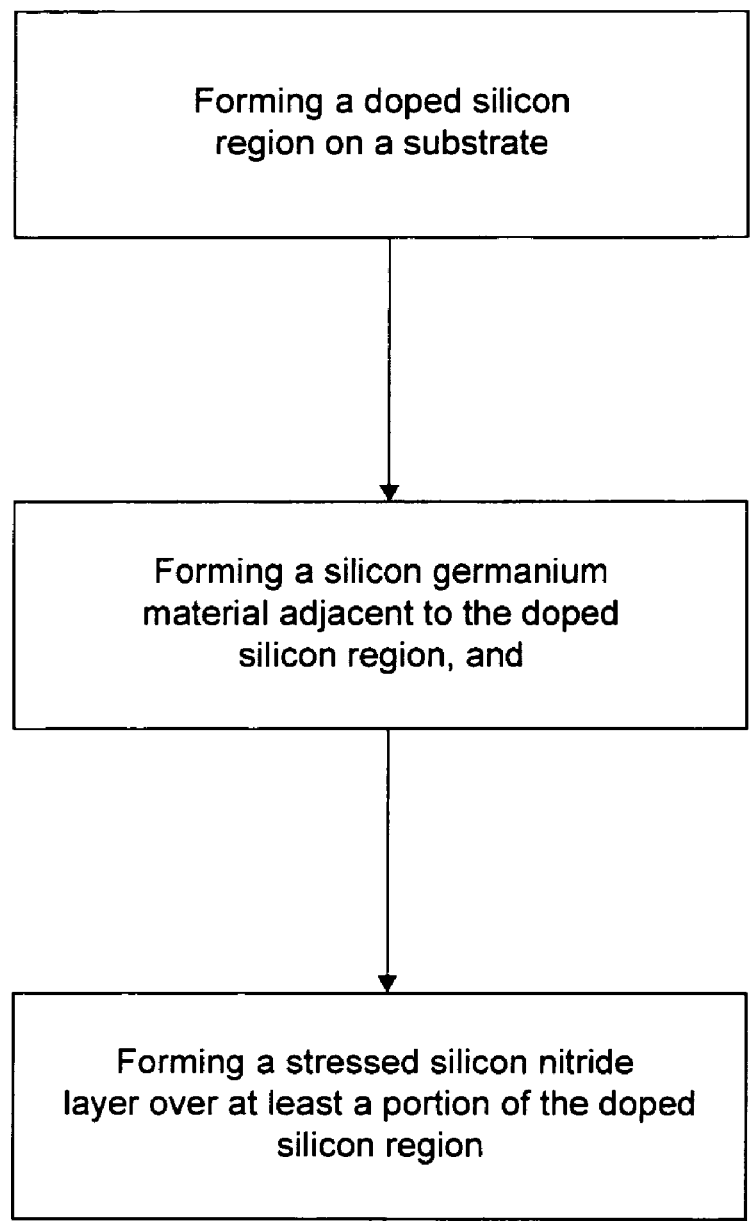
FIG. 3 is a flow chart illustrating an embodiment of a method of forming a semiconductor device.

A general method of forming the improved semiconductor device having the stress-inducing silicon germanium material 202 and stressed layer 208 is illustrated in FIG. 3. The method comprises forming a doped silicon region 397 on the substrate 400. For example, the doped silicon region 397 may comprise silicon having n or p-type dopants, and may form at least a portion of the channel region 396. A silicon germanium material 202 is formed adjacent the doped silicon region 397. For example, the silicon germanium material 202 may be formed in source and drain regions 404,408 that are adjacent a channel region 396 having the doped silicon. A stressed silicon nitride layer 208a is then formed over at least a portion of the doped silicon region 396, and may comprise a tensile or compressive stress. The silicon germanium material 202 and stressed silicon nitride layer 208a cooperate to enhance the performance of the semiconductor device.

In yet another version, the stressed layer 208 comprises a stressed silicon oxide layer 208d. The stressed silicon oxide layer 208d may be formed by a deposition method that deposits a silicon oxide layer having a tensile or compressive stress on the substrate 400. For example, silicon oxide may be deposited by a High Aspect Ratio Process (HARP), which may include using an $O_3$/tetraethoxy silane (TEOS) based sub-atmospheric chemical vapor deposition (SACVD) process, as described for example in U.S. patent application Ser. No. 10/846,734 to Arghavani et al, filed on May 14, 2004 and commonly assigned to Applied Materials, which is herein incorporated by reference in its entirety. In one version, the stressed silicon oxide layer 208d comprises a tensile stress of at least about 800 MPa, such as from about 800 MPa to about IGPa. In the version shown in FIG. 1, the stressed silicon oxide layer 208d is formed adjacent to and surrounding at least part of the source and drain regions 404,408, and may comprise for example a shallow isolation trench 412. In one version, another stressed layer 208b on the substrate 400 comprises a pre-metal dielectric layer 452, which may be formed by a HARP method similarly to the stressed silicon oxide layer 208d, and may also be formed by another method. The pre-metal dielectric layer 452 can comprise a stressed dielectric layer 208b having a tensile stress of at least about 200 MPa, such as from about 200 MPa to about 400 MPa. In the version shown in FIG. 1, the pre-metal dielectric layer 425 is formed above the channel region 396 and over the silicon nitride layer 208a.

In yet another version, the stressed layer 208 comprises a stressed silicide layer 208c, such as for example at least one of nickel silicide, tungsten silicide, and cobalt silicide. The silicide layer 208c can be formed by a suitable metal silicide deposition method, such as a physical vapor deposition method, and may even comprise a salicide layer, which is a self-aligned silicide layer. The silicide layer 208c can comprise a compressive or tensile stress, according to the desired transistor characteristics. In one embodiment, as shown in FIG. 1, the silicide layer 208c can be formed over one or more of the source and drain regions 404,408 to improve electrical contact with these regions.

Suitable arrangements of the first and second stress-inducing materials 200,206 on the substrate 400 will now be described with reference to FIG. 1. Although the first and second stress-inducing materials 200, 206 are described as a part of a MOSFET 392, the materials 200,206 can be useful in other structures formed on a substrate, such as for example, other types of transistors such as bipolar junction transistors, capacitors, sensors, and actuators. The transistor 392 illustrated in FIG. 1 comprises a semiconductor substrate 400 comprising, for example, silicon. The substrate 400 may also comprise other semiconductor materials such as germanium, silicon germanium, gallium arsenide, or combinations thereof. Additionally, in some instances the substrate 400 may comprise an insulator. In one version, the transistor 392 illustrated in FIG. 1 is a negative channel, or n-channel, MOSFET (NMOS) having source and drain regions 404, 408 that may be doped with a Group VA element, such as phosphorous or arsenic, to form an n-type semiconductor. At least one of the source and drain regions 404,408 comprises the silicon germanium material 202. In the NMOS transistor, the substrate 400 outside of the source and drain regions 404, 408 is typically doped with a Group IIIA element, such as boron, to form a p-type semiconductor. In another version, however, the MOSFET transistor 392 may comprise a positive channel, or p-channel MOSFET (PMOS) having source and drain region 404,408 that are doped with a Group IIIA element to form a p-type semiconductor. In a PMOS transistor, the transistor 392 may comprise a substrate 400 comprising an n-type semiconductor or may have a well region (not shown) comprising a n-type semiconductor formed on an substrate 400 comprising a p-type semiconductor.

In the version shown in FIG. 1, the transistor 392 comprises a trench 412 to provide isolation between transistors 392 or groups of transistors 392 on the substrate 400, a technique known as shallow trench isolation. The trench 412 is typically formed prior to the source and drain regions 404, 408 by an etch process. A trench side wall liner layer (not shown) may be formed in the trench 412 by, for example, a rapid thermal oxidation in an oxide/oxinitride atmosphere, which may also round sharp corners on the trench 412 (and elsewhere). In one version, the trench 412 may comprise a stressed layer 208d and may be filled with material 416 having a tensile stress, such as a stressed silicon oxide material, which can also provide a stress to the channel region 396. Excess trench material 416 may be removed by, for example, chemical mechanical polishing.

The transistor comprises a gate oxide layer 420 and a gate electrode 424 on top of the channel region 396 and between the source and drain regions 404, 408. In the version shown, the transistor 392 also comprises silicide layers 432 on top of the source and drain regions 404, 408 as well as the gate electrode 424. The silicide layers 432 are highly conductive compared to the underlying source and drain regions 404, 408 and gate electrode 424, and facilitate the transfer of electric signals to and from the transistor 392 through metal contacts 428. Depending on the desired transistor characteristics, the silicide layers 432 may also comprise stressed silicide layers 208c having at least one of a tensile stress and compressive stress to induce stress in the channel region 396. The transistor shown also comprises spacers 436 and oxide-pad layers 440 which may be located on opposite sidewalls of the gate electrode 424 to keep the silicide layers 432 separated during a silicidation process to form the silicide layers 432. During silicidation, a continuous metal layer (not shown) is deposited over the oxide-containing source and drain regions 404,408 and gate electrode 424, as well as the nitride containing spacers 436. The metal reacts with the underlying silicon in the source and drain regions 404,408 and gate electrode 424 to form metal-silicon alloy silicide layers, but are less reactive with the nitride materials in spacers 436. Thus, the spacers 436 allow the overlying, unreacted metal to be etched away while not affecting the metal alloy in silicide layers 432.

The length of the channel region 396 is shorter than the length of the gate oxide layer 420. The length of the channel region 396 measured between the edges of the source region 404 and the drain region 408 may be about 90 nm or less, for example, from about 90 nm to about 10 nm. As the length of channel region 396 gets smaller, implants 448, also known as halos, may be counterdoped into the channel region 396 to prevent charge carriers from uncontrollably hopping from the source region 404 to the drain region 408 and vice versa.

In the version shown in FIG. 1, a silicon nitride layer 388 is formed above the silicide layers 432 and over the channel region 396 and gate electrode 424. The silicon nitride layer 388 typically acts as a contact-etch stop layer as well as a providing stress to the channel region 396. The silicon nitride layer 388 can comprise a stressed nitride layer 208a that is capable of being deposited to have a stress values ranging from compressive to tensile stresses. The selection of the stress in the silicon nitride layer 388 selects the type of stress provided to the channel region 396 of the transistor 392.

Following the formation of the silicon nitride layer 388, a dielectric layer 452, also referred to as a pre-metal dielectric layer 452, may be deposited on the silicon nitride layer 388. The dielectric layer 452 may be, for example, borophosphosilicate glass, phosphosilicate glass, borosilicate glass, and phosphosilicate glass, among other materials. The dielectric layer 452 may be formed using HARP that includes $O_3$/TEOS in conjunction with SACVD. The dielectric layer 452 may also comprise a stressed dielectric layer 208b comprising a tensile stress or compressive stress which produces a stress in the channel region 396.

EXAMPLES

Example 1

Figure 4:
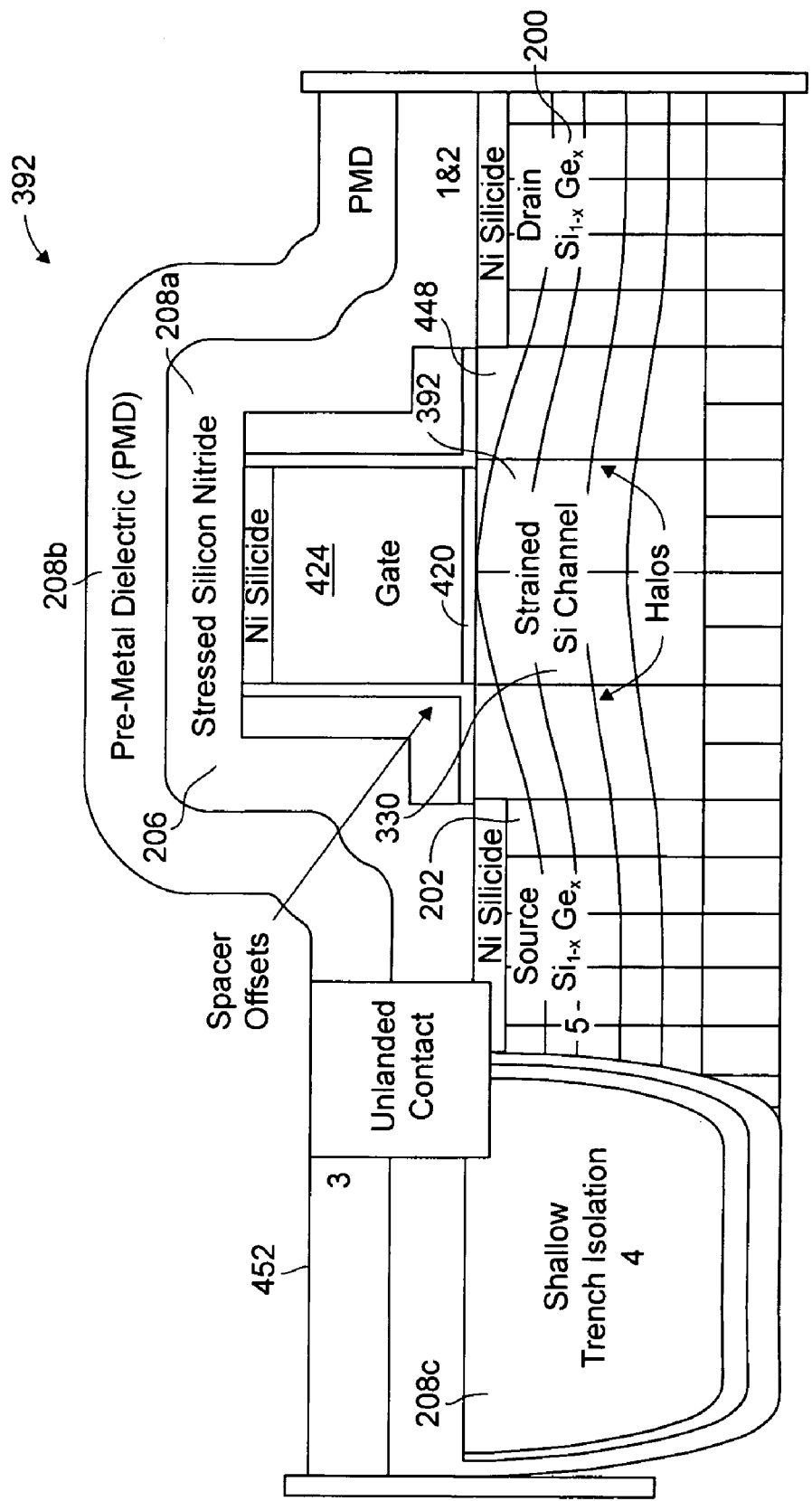
FIG. 4 is a cross-sectional side view of an embodiment of a transistor having different stress-inducing materials and showing the stress lines induced in a channel region.

In this example, the transistor 392 comprises first and second stress-inducing materials 200, 206 that are selected and tailored to provide optimum performance for a PMOS transistor. FIG. 4 shows an example of a transistor 392 having the transistor elements including stress-inducing materials 200, which are labeled according to embodiments suitable for PMOS or NMOS transistors 392. In this version, the first stress-inducing material 200 comprises silicon germanium material 202 that forms the source and drain regions 404,408 of the transistor 392. The silicon germanium material 202 extends throughout the source and drain 404,408 and is labeled as element 5 on FIG. 4. The silicon-germanium material 202 may be doped with for example boron to provide further enhancement of the transistor 392. The silicon-germanium material 202 induces a stress in the channel region 392 of at least about 1 GPa. Following formation of the silicon-germanium layers 202, a stressed silicon nitride layer 208a is formed over at least a portion of the channel region 396, and may also be formed over at least a portion of the source and drain regions 404,408. The stressed silicon nitride layer 208a desirably comprises a compressive stress to provide optimum PMOS performance, such as a compressive stress having an absolute value of at least about 2.5 GPa. The compressively stressed silicon nitride layer 208a is labeled as element 2 on FIG. 4. Thus, the elements 2 and 5 in FIG. 4, namely the compressively stressed silicon nitride layer 208a and the silicon germanium material 202, cooperate to provide the desired stress in the silicon channel 392 to give the desired PMOS transistor component. The compressively stressed silicon nitride layer 208a cooperates with the silicon germanium material 202 to provide the desired stress in the channel region 396, and provide improved carrier ability and a larger saturation current. Compressive stress-forming materials are beneficial to the PMOS structure because the compressive stress improves hole mobility in the channel region 392. The stress lines 330 in the channel region 392 shown in FIG. 4 illustrate an example of type of stress induced in the channel region by the first and second stress-inducing materials 200,206.

Example 2

In this example, the transistor 392 comprises first and second stress-inducing materials 200, 206 that are selected and tailored to provide optimum performance for a NMOS transistor. In this version, the first stress-inducing material 200 comprises a silicon germanium material 202 that form the source and drain regions 404,408 of the transistor 392, and which may also be doped. The silicon germanium material 202 is labeled as element 5 in FIG. 4. In this version, the silicon germanium material 202 induces a stress in the channel region 392 of at least about 1 GPa. Following formation of the silicon-germanium material 202, a stressed silicon nitride layer 208a is formed over at least a portion of the channel region 396, and may also be formed over at least a portion of the source and drain regions 404,408. However, in this version the stressed silicon nitride layer 208a comprises a tensile stressed silicon nitride layer 208a, having a tensile stress of at least about 1.5 GPa, such as from about. The tensile stressed silicon nitride layer is labeled as element 1 in FIG. 4. Tensile stress-forming materials are beneficial to the NMOS structure because the tensile stress improves electron mobility in the channel region 392. Added tensile stress may be provided in the NMOS transistor by, for example forming a stressed silicon oxide layer 208c, for example a stressed silicon oxide isolation trench having a tensile stress of at least about 800 MPa. The stressed silicon oxide layer 208c is labeled as element 4, the shallow trench isolation dielectric, in FIG. 4. The NMOS transistor can also comprise other tensile materials, such as for example by forming a pre-metal dielectric layer 452 comprising a tensile stressed dielectric layer 208b of material, such as a stressed dielectric layer having a stress of at least about 800 MPa. The pre-metal dielectric layer 452, also sometimes called the interlayer dielectric, is labeled as element 3 in FIG. 4. Thus, in this embodiment, the elements 1, 3, 4 and 5 in FIG. 4, namely the tensile stressed silicon nitride layer 208a, the tensile stressed pre-metal dielectric layer 452, the tensile stressed silicon oxide layer 208c and the silicon germanium material 202, cooperate to provide the desired stress in the silicon channel 396 to give the desired performance improvement in the NMOS transistor 392.

Example 3

Figure 5:
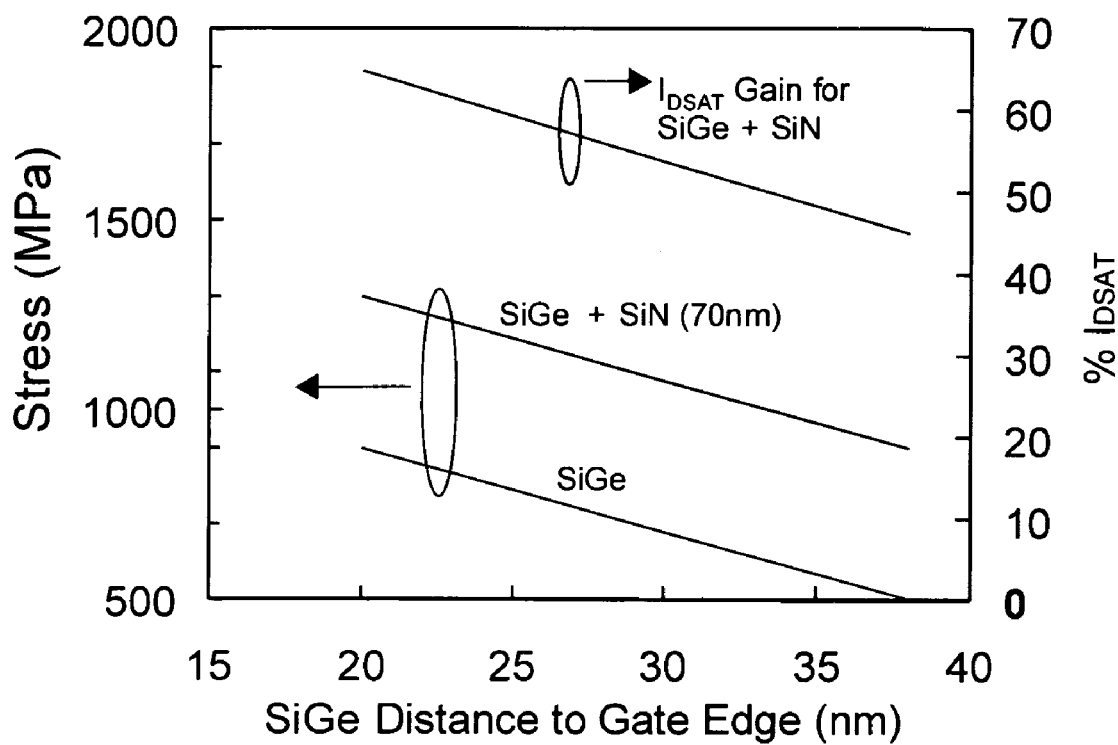
FIG. 5 is a graph of the stress induced in a channel region and the gain in saturation current for increasing distance of source and drain regions from a gate for devices having different stressed materials.

In this example, the stress induced in the channel region 396 was determined by simulation for a device having first and second stress-inducing materials 200, 206 and compared to a device having a just a single stress-inducing material. The results of the simulation are shown in the graph of FIG. 5. The bottom-most line on the graph in FIG. 5 indicates the stress induced by a single stress-inducing material, namely silicon germanium material in the source and drain regions 404,408, for increasing distances of the source and drain regions 404,408 from the gate 424. The stress in the channel region 396 was about 500 MPa for source and drain regions 404,408 placed at a distance of about 37 nm from the gate 424, and increased to a stress of about 900 MPa for source and drain regions 404,408 placed more closely to the gate 424 at a distance of only about 20 nm. The middle line on the graph in FIG. 5 indicates the stress induced by first and second stress-inducing materials 200,206, namely silicon germanium material 202 in the source and drain regions 404,408, and a compressively stressed silicon nitride layer 208a, for increasing distances of the source and drain regions 404,408 from the gate 424. The figure shows the stress increasing from a value of a little under about 1000 MPa to a value of about 1300 MPa as the distance of the source and drain regions 404,408 from the gate 424 decreases from about 37 nm to about 20 nm. This stress is substantially and unexpectedly higher than the stress induced by the silicon germanium material alone, with the stress being increased by about 44%. Furthermore, the top line of FIG. 5 shows the percentage increase in the saturation drive current (% $I_{DSAT}$) for the first and second materials 200,206 over the silicon germanium material alone, at increasing distances of the source and drain regions 404,408 from the gate 424. The saturation drive current is about 45% greater for the first and second stress-inducing materials 200,206 at a distance of the source and drain regions 404,408 from the gate 424 of about 37 nm, and increases to percentage increase of about 65% at a distance of the source and drain regions 404,408 from the gate 424 of about 20 nm. Thus, a 65% saturation current gain is exhibited for first and second stress-inducing materials 200,206 that induce a stress of about 1300 MPa in the channel region 396. Accordingly, the first and second stress-inducing materials 200,206 provide unexpectedly good results in increasing the induced stress in the channel region 396 and saturation drive current of the transistor 392 over the use of silicon germanium material 202 alone.

Example 4

Figures 6A, 6B:
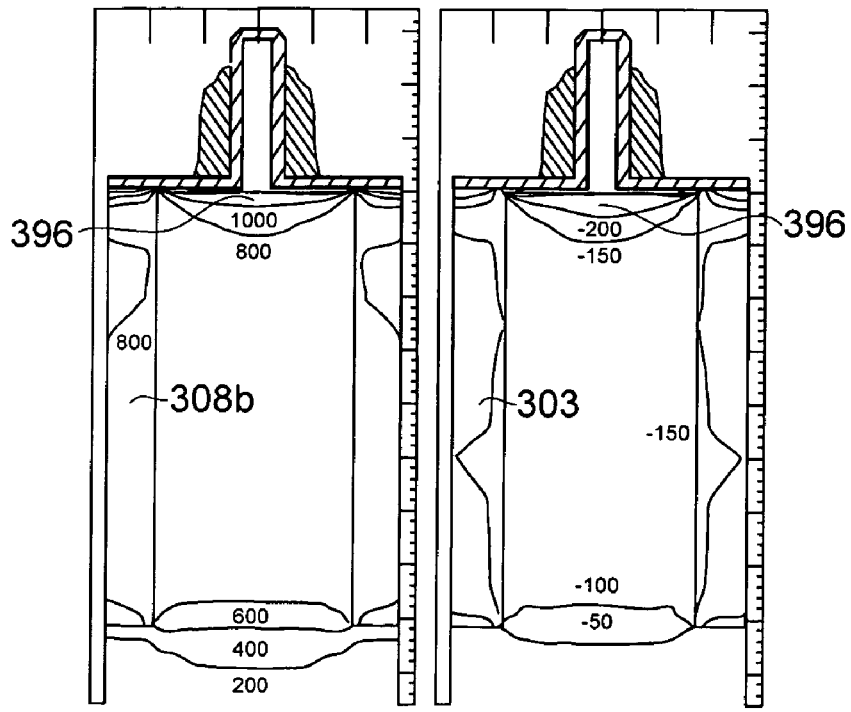
FIGS. 6a and 6b are embodiments simulations of the stress induced in a channel region by adjacent silicon oxide materials.

In this example, the stress induced in a channel region 396 was simulated for a stress-inducing material comprising a stressed silicon oxide layer 208b versus a substantially less stressed silicon oxide layer 303. FIG. 6a shows the stress induced in the silicon channel region 396 and other regions of the substrate by a stressed silicon oxide layer 208b deposited by a HARP deposition method which forms a tensile-stressed silicon oxide material. FIG. 6b shows the stress in the silicon channel region 396 and other regions of the substrate by a silicon oxide layer 303 deposited by a High Density Plasma (HDP) deposition method. FIG. 6a demonstrates that the channel 296 experiences a much higher stress, of around 1000 MPa, when the tensile stressed silicon oxide layer 208b is provided adjacent the silicon channel 396. In contrast, the HDP deposition method and less stressed silicon oxide material provides a compressive stress of about −200 MPa in the channel region 396. Thus, the tensile stressed silicon oxide layer 208b can provide increased levels of stress in the channel region 396 to provide the desired transistor characteristics.

Figure 2:
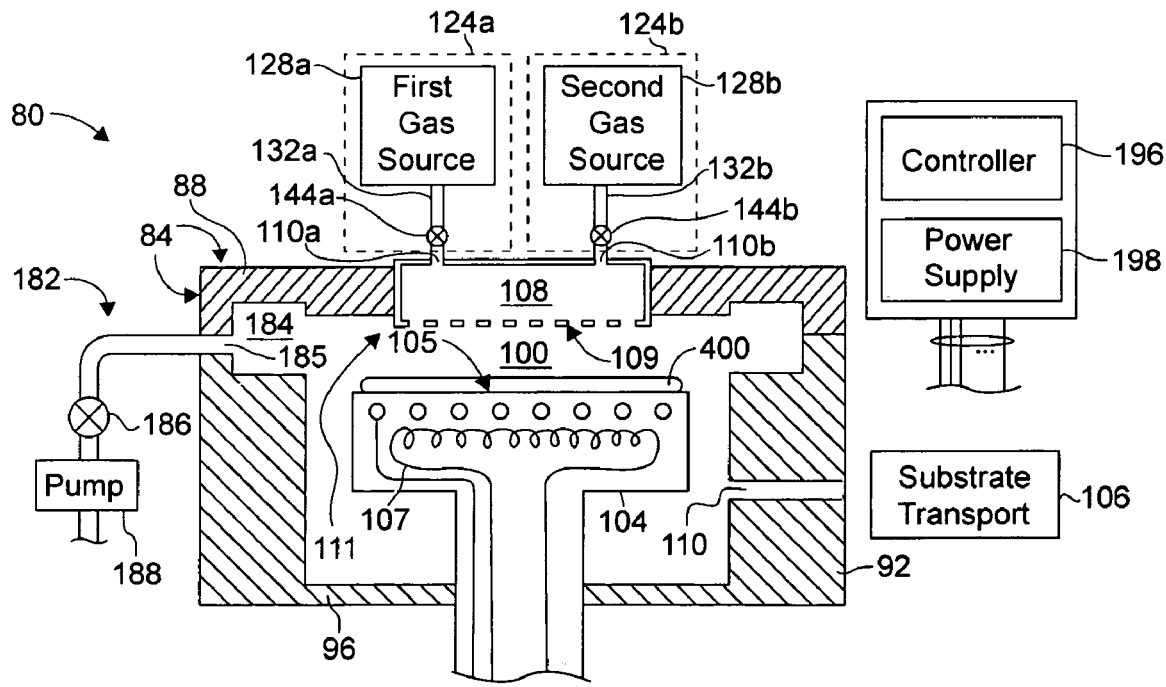
FIG. 2 is sectional side view of an embodiment of a deposition chamber.

An embodiment of a substrate processing chamber 80 that can be used for forming materials and layers on a substrate, such as for example silicon germanium materials 202 and stressed layers 208, is schematically illustrated in FIG. 2. While an exemplary chamber is used to illustrate the invention, other chambers having different components and structures as would be apparent to one of ordinary skill in the art may also be used, and also separate chambers may be used for separate steps in a semiconductor device fabrication process. For example, a first chamber may be provided for forming a first stress-inducing material 200, such as an epitaxially grown silicon germanium material 202, and the substrate 400 may be transferred to a second chamber for subsequent processing, including deposition of a second stress-inducing material 206 such as a stressed silicon nitride layer 208a. Accordingly, the scope of the invention should not be limited to the exemplary embodiment of the chamber or other components provided herein. The chamber 80 illustrated in FIG. 2 is a plasma enhanced chemical vapor deposition (PE-CVD) chamber suitable for processing a substrate 400, such as a silicon wafer. For example, a suitable chamber is a Producer® SE type chamber from Applied Materials, Santa Clara, Calif. The chamber 80, as, comprises enclosure walls 84, which include a ceiling 88, sidewalls 92, and a bottom wall 96, that enclose a process zone 100. The chamber 80 may also comprise a liner (not shown) that lines at least a portion of the enclosure walls 84 about the process zone 100.

In a processing cycle, a substrate 400 is placed on a substrate support 104 by a substrate transport 106 such as, for example, a robot arm, through an inlet port 110. The substrate support 104 can be moved to a lower position for loading and unloading. The substrate support 104 can include an enclosed electrode 105 that is used to generate a plasma from process gas introduced into the chamber. The substrate support 104 can be heated by heater 107, which can be an electrically resistive heating element (as shown), a heating lamp (not shown), or the plasma itself. The substrate support 104 typically comprises a ceramic structure which has a receiving surface to see the substrate, and protects the electrode 105 and heater 107 in the support from the chamber environment. In use, a high frequency voltage is applied to the electrode 105 and a DC voltage is applied to the heater 107. The electrode 105 in the substrate support 104 can also be used to electrostatically clamp the substrate 400 to the support 104. The substrate support 104 may also comprise one or more rings (not shown) that at least partially surround a periphery of the substrate 400 on the support 104.

After a substrate 400 is loaded onto the support 104, the support 104 is raised to a processing position that is closer to the gas distributor 108 to provide a desired spacing therebetween. The gas distributor 108 is located above the process zone 100 for dispersing a process gas uniformly across the substrate 400. The gas distributor 108 can be capable of separately delivering two independent streams of first and second process gas to the process zone 100 without mixing the gas streams prior to their introduction into the process zone 100, or can premix the process gas before providing the premixed process gas to the process zone 100. The substrate processing chamber 80 also comprises first and second gas supplies 124a,b to deliver the first and second process gas to the gas distributor 108, the gas supplies 124a,b each comprising a gas source 128a,b, one or more gas conduits 132a,b, and one or more gas valves 144a,b. For example, in one version, the first gas supply 124a comprises a first gas conduit 132a and a first gas valve 144a to deliver a first process gas from the gas source 128a to a first inlet 110a of the gas distributor 108, and the second gas supply 124b comprises a second gas conduit 132b and a second gas valve 144b to deliver a second process gas from the second gas source 128b to a second inlet 110b of the gas distributor 108.

The process gas can be energized by a gas energizer 111 that couples electromagnetic energy, for example, high frequency voltage energy to the process gas to form a plasma from the process gas. To energize the first process gas, a voltage is applied between (i) the electrode 105 in the support 104, and (ii) a second electrode 109 which may be the gas distributor 108, or can be the ceiling 88 or chamber sidewall 92. The voltage applied to the electrodes 105, 109 capacitatively couples energy to the process gas in the process zone 100. In one version, a voltage is applied to the first electrode 105 at a frequency of from about 350 kHz to about 60 MHz, and a power level of from about 10 W to about 1000 W. The second electrode 109 may be grounded.

The chamber 80 also comprises a gas exhaust 182 to remove spent process gas and byproducts from the chamber 80 and maintain a predetermined pressure of process gas in the process zone 100. In one version, the gas exhaust 182 includes a pumping channel 184 that receives spent process gas from the process zone 100, an exhaust port 185, a throttle valve 186 and one or more exhaust pumps 188 to control the pressure of process gas in the chamber 80. The exhaust pumps 188 may include one or more of a turbomolecular pump, cryogenic pump, roughing pump, and combination-function pumps that have more than one function. The chamber 80 may also comprise an inlet port or tube (not shown) through the bottom wall 96 of the chamber 80 to deliver a purging gas into the chamber 80. The purging gas typically flows upward from the inlet port past the substrate support 104 and to an annular pumping channel. The purging gas is used to protect surfaces of the substrate support 104 and other chamber components from undesired deposition during the processing. The purging gas may also be used to affect the flow of process gas in a desirable manner.

The chamber 80 also comprises a controller 196 that controls activities and operating parameters of the chamber 80. The controller 196 may comprise, for example, a processor and memory. The processor executes chamber control software, such as a computer program stored in the memory. The memory may be a hard disk drive, read-only memory, flash memory or other types of memory. The controller 196 may also comprise other components, such as a floppy disk drive and a card rack. The card rack may contain a single-board computer, analog and digital input/output boards, interface boards and stepper motor controller boards. The chamber control software includes sets of instructions that dictate the timing, mixture of gases, chamber pressure, chamber temperature, microwave power levels, high frequency power levels, susceptor position, and other parameters of a particular process. The chamber 80 also comprises a power supply 198 to deliver power to various chamber components such as, for example, the electrode 105 in the substrate support 104, heater 107, or other chamber components.

The substrate processing chamber 80 also comprises a temperature sensor (not shown) such as a thermocouple or an interferometer to detect the temperature of surfaces, such as component surfaces or substrate surfaces, within the chamber 80. The temperature sensor is capable of relaying its data to the chamber controller 196 which can then use the temperature data to control the temperature of the processing chamber 80, for example by controlling the resistive heating element in the substrate support 104.

The present invention has been described with reference to certain preferred versions thereof; however, other versions are possible. For example, the stress-inducing materials 200,206 can be used in other types of substrates and transistors, as would be apparent to one of ordinary skill, for example. Other configurations of the stress-inducing materials and other materials can also be used. Further, alternative steps equivalent to those described for the transistor fabrication method, and methods of forming the stress-inducing materials 200,206 can also be used in accordance with the parameters of the described implementation, as would be apparent to one of ordinary skill. Therefore, the spirit and scope of the appended claims should not be limited to the description of the preferred versions contained herein.

What is claimed is:

1. A method of fabricating a semiconductor device, the method comprising:
   (a) forming a doped silicon region on a substrate;
   (b) forming on the substrate, a silicon germanium material adjacent to the doped silicon region to induce a stress in the doped silicon region;
   (c) forming on the substrate, a stressed silicon nitride layer over at least a portion of the doped silicon region to further stress the doped silicon region; and
   (d) forming a stressed dielectric layer having a tensile stress of at least about 200 MPa over at least a portion of the stressed silicon nitride layer.

2. A method according to claim 1 wherein (b) comprises epitaxially growing silicon germanium material on the substrate, the silicon germanium material having the chemical stoichiometry of $Si_{1-x}Ge_x$, where x is from about 0.15 to about 0.3.

3. A method according to claim 1 wherein (b) comprises forming silicon germanium material having a chemical stoichiometry of $Si_{1-x}Ge_x$, where x is selected to induce a stress of at least about 1 GPa in the doped silicon region.

4. A method according to claim 1 wherein (a) comprises forming a transistor having a source and drain, a channel between the source and drain, and a gate above the channel, and (b) comprises forming the silicon germanium material to extend throughout the source and drain.

5. A method according to claim 1 wherein (c) comprises forming a stressed silicon nitride layer comprising a compressive stress having an absolute value of at least about 2.5 GPa.

6. A method according to claim 1 wherein (c) comprises forming a stressed silicon nitride layer comprising a tensile stress of at least about 1.5 GPa.

7. A method according to claim 6 further comprising forming a stressed silicon oxide layer surrounding at least part of the source and drain, the stressed silicon oxide layer having a tensile stress of at least about 800 MPa.

8. A method according to claim 1 further comprising forming a stressed metal silicide layer over at least a portion of the silicon germanium material.

9. A semiconductor device fabricated according to the method of claim 1.

10. A method of fabricating a semiconductor device, the method comprising:
    (a) forming a transistor on a substrate by:
        (i) forming a source and a drain on the substrate, each of the source and drain comprising silicon germanium material extending throughout the source and drain; and
        (ii) forming a channel region configured to conduct charge between the source and drain, the channel region comprising doped silicon, whereby stress is induced in the channel region by the silicon germanium material extending throughout the source and drain; and
    (b) forming a stressed silicon nitride layer over at least a portion of the transistor, the stressed silicon nitride layer being capable of inducing stress in the channel region; and
    (c) forming a stressed dielectric layer over at least a portion of the stressed silicon nitride layer,
    whereby the silicon germanium material, overlying stressed silicon nitride layer and stressed dielectric layer induce stress in the channel region that increases the carrier mobility of channel region.

11. A method according to claim 10 wherein (a) comprises epitaxially growing the silicon germanium in the source and drain, the silicon germanium material having the chemical stoichiometry of $Si_{1-x}Ge_x$, where x is from about 0.15 to about 0.3.

12. A method according to claim 10 wherein (a) comprises forming source and drain comprising silicon germanium material having a chemical stoichiometry of $Si_{1-x}Ge_x$, where x is selected to induce a stress of at least about 1 Pa in the channel region.

13. A method according to claim 10 wherein (b) comprises depositing a layer of silicon nitride by a chemical vapor deposition method having deposition parameters selected to deposit a layer of silicon nitride having a compressive stress having an absolute value of at least about 2.5 GPa.

14. A method according to claim 10 wherein (b) comprises depositing a layer of silicon nitride by a chemical vapor deposition method having deposition parameters selected to deposit a layer of silicon nitride having a tensile stress of at least about 1.5 GPa.

15. A method according to claim 10 wherein the stressed dielectric layer has a tensile stress of at least about 200 MPa.

16. A method according to claim 10 further comprising forming a stressed silicon oxide layer surrounding at least part of the drain and source, the stressed silicon oxide layer having a tensile stress of at least about 800 MPa.

17. A method according to claim 10 further comprising forming a stressed metal silicide layer over at least a portion of the source and drain.

18. A semiconductor device comprising:
    (a) a transistor comprising:
        (i) source and drain comprising silicon germanium material; and
        (ii) a channel region configured to conduct charge between the source and drain, the channel region comprising doped silicon, whereby stress is induced in the channel region by the silicon germanium material;
    (b) a stressed silicon nitride layer over at least a portion of the transistor, the stressed silicon nitride layer being capable of inducing stress in the channel region, and
    (c) a stressed dielectric layer having a tensile stress of at least about 200 MPa over at least a portion of the stressed silicon nitride layer,
    whereby the silicon germanium material, overlying stressed silicon nitride layer and stressed dielectric layer induce stress in the channel region that increases the carrier mobility of the channel region.

19. A device according to claim 18 wherein the source and drain comprise epitaxially grown silicon germanium material, the silicon germanium material having the chemical stoichiometry of $Si_{1-x}Ge_x$, where x is from about 0.15 to about 0.3.

20. A device according to claim 18 wherein the source and drain comprise silicon germanium material extending throughout the source and drain, the silicon germanium material having a chemical stoichiometry of $Si_{1-x}Ge_x$, where x is selected to induce a stress of at least about 1 GPa in the channel region.

21. A device according to claim 18 wherein the stressed silicon nitride layer comprises a compressive stress having an absolute value of at least about 2.5 GPa.

22. A device according to claim 18 wherein the stressed silicon nitride layer comprises a tensile stress at least about 1.5 GPa.

23. A device according to claim 22 further comprising a stressed silicon oxide layer surrounding at least part of the drain and source, the stressed silicon oxide layer having a tensile stress of at least about 800 MPa.

24. A device according to claim 18 further comprising a stressed metal silicide layer over at least a portion of the source and drain.

25. A method of fabricating a semiconductor device, the method comprising:
  (a) forming a transistor on a substrate by:
    (i) forming a source and a drain on the substrate, each of the source and drain comprising silicon germanium material extending throughout the source and drain; and
    (ii) forming a channel region configured to conduct charge between the source and drain, the channel region comprising germanium, whereby stress is induced in the channel region by the silicon germanium material in the source and drain; and
  (b) forming a stressed silicon nitride layer over at least a portion of the transistor, the stressed silicon nitride layer being capable of inducing stress in the channel region,
  whereby the silicon germanium material and the overlying stressed silicon nitride layer induce stress in the channel region that increases the carrier mobility of the channel region.

26. A semiconductor device comprising:
  (a) a transistor comprising:
    (i) source and drain comprising silicon germanium material extending throughout the source and drain; and
    (ii) a channel region configured to conduct charge between the source and drain, the channel region comprising germanium, whereby stress is induced in the channel region by the silicon germanium material; and
  (b) a stressed silicon nitride layer over at least a portion of the transistor, the stressed silicon nitride layer being capable of inducing stress in the channel region,
  whereby the silicon germanium material and the overlying stressed silicon nitride layer induce stress in the channel region that increase the carrier mobility of the channel region.

27. A method according to claim 1 wherein the stressed dielectric layer comprises one of borophosphosilicate, phosphosilicate, borosilicate, and phosphosilicate glass.

28. A method of fabricating a semiconductor device, the method comprising:
  (a) forming a transistor on a substrate by:
    (i) forming a source and a drain on the substrate, each of the source and drain comprising silicon germanium material extending throughout the source and drain, the silicon germanium material having a chemical stoichiometery of $Si_{1-x}Ge_x$, where x is from about 0.15 to about 0.3; and
    (ii) forming a channel region configured to conduct charge between the source and drain, the channel region comprising doped silicon, whereby stress is induced in the channel region by the silicon germanium material in the source and drain; and
  (b) forming a stressed silicon nitride layer having a tensile stress of at least about 1.5 GPa over at least a portion of the transistor, the stressed silicon nitride layer being capable of inducing stress in the channel region; and
  (c) forming a stressed dielectric layer having a tensile stress of at least about 200 MPa over at least a portion of the stressed silicon nitride layer,
  whereby the silicon germanium material, overlying stressed silicon nitride layer and stressed dielectric layer induce stress in the channel region that increases the carrier mobility of channel region.

29. A semiconductor device comprising:
  (a) a transistor comprising:
    (i) a source and drain comprising silicon germanium material extending throughout the source and drain, the silicon germanium material having a chemical stoichiometery of $Si_{1-x}Ge_x$, where x is from about 0.15 to about 0.3; and
    (ii) a channel region configured to conduct charge between the source and drain, the channel region comprising germanium, whereby stress is induced in the channel region by the silicon germanium material;
  (b) a trench adjacent to the transistor and comprising a stressed dielectric material, the trench having a width and height, the width greater than the height;
  (c) a stressed silicon nitride layer with a compressive stress having an absolute value of at least about 2.5 GPa over at least a portion of the transistor, the stressed silicon nitride layer being capable of inducing stress in the channel region; and
  (d) a stressed dielectric layer over at least a portion of the stressed silicon nitride layer,
  whereby the silicon germanium material and the overlying stressed silicon nitride layer induce stress in the channel region that increases the carrier mobility of the channel region.

* * * * *